United States Patent
Carter et al.

(10) Patent No.: US 9,053,254 B2
(45) Date of Patent: Jun. 9, 2015

(54) MASSIVE MODEL VISUALIZATION IN PDM SYSTEMS

(75) Inventors: Michael B. Carter, Ames, IA (US); Jeremy S. Bennett, Ames, IA (US); Jianbing Huang, Shoreview, MN (US); Guy Roetcisoender, Mosier, OR (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 104 days.

(21) Appl. No.: 13/606,590

(22) Filed: Sep. 7, 2012

(65) Prior Publication Data

US 2013/0132432 A1     May 23, 2013

(30) Foreign Application Priority Data

Nov. 23, 2011   (IN) .......................... 1486/KOL/2011

(51) Int. Cl.
| | |
|---|---|
| G06F 17/30 | (2006.01) |
| G06F 17/50 | (2006.01) |
| G06T 17/00 | (2006.01) |
| G06T 15/00 | (2011.01) |
| G06T 19/00 | (2011.01) |

(52) U.S. Cl.
CPC .......... *G06F 17/50* (2013.01); *G06F 17/30672* (2013.01); *G06F 17/30994* (2013.01); *G06F 17/30713* (2013.01); *G06T 17/005* (2013.01); *G06T 15/005* (2013.01); *G06T 19/00* (2013.01); *G06T 2200/16* (2013.01)

(58) Field of Classification Search
USPC .................................................. 707/711, 770
See application file for complete search history.

(56) References Cited

U.S. PATENT DOCUMENTS

| | | | | |
|---|---|---|---|---|
| 4,862,376 | A | * | 8/1989 | Ferriter et al. ................. 700/107 |
| 4,875,162 | A | * | 10/1989 | Ferriter et al. .................. 705/29 |
| 6,057,847 | A | | 5/2000 | Jenkins |

(Continued)

FOREIGN PATENT DOCUMENTS

| | | |
|---|---|---|
| EP | 1 804 187 A2 | 7/2007 |
| EP | 2 261 827 A1 | 12/2010 |

OTHER PUBLICATIONS

PCT International Search Report dated Feb. 12, 2013 corresponding to PCT Application No. PCT/US2012/065967 filed Nov. 20, 2012 (14 pages).

(Continued)

*Primary Examiner* — Kim Nguyen (57) ABSTRACT

Massive model visualization in product data management (PDM) systems. A method includes storing a massive model database for a product data structure in a PDM server system, including storing a spatial bounding box hierarchy that acts as a spatial index for spatial bounding boxes of a plurality of unconfigured components of the product data structure and storing a cell table that associates cells of the spatial bounding box hierarchy to corresponding component identifiers of the product data structure. The method includes responding to component identifier requests from a client system by sending requested component identifiers from the product data structure to the client system. The component identifier requests correspond to visible components of an assembly represented by the product data structure. The method includes transmitting geometric data to the client system, the geometric data corresponding to components of the product data structure associated with the requested component identifiers.

24 Claims, 6 Drawing Sheets

(56) References Cited

U.S. PATENT DOCUMENTS

| | | | |
|---|---|---|---|
| 6,118,456 | A | 9/2000 | Cooper |
| 6,377,263 | B1 | 4/2002 | Falacara et al. |
| 6,898,560 | B1 | 5/2005 | Das |
| 6,933,946 | B1 | 8/2005 | Silva et al. |
| 7,127,308 | B2 | 10/2006 | Bigelow |
| 7,617,444 | B2 | 11/2009 | Rothschillwe et al. |
| RE41,476 | E * | 8/2010 | Muehleck et al. ............ 700/107 |
| 8,046,379 | B1 * | 10/2011 | Yu et al. ......................... 707/783 |
| 2002/0004710 | A1 | 1/2002 | Murao |
| 2002/0035463 | A1 | 3/2002 | Lynch et al. |
| 2002/0162081 | A1 | 10/2002 | Solomon |
| 2002/0184246 | A1 | 12/2002 | Shkolnik |
| 2004/0117393 | A1 | 6/2004 | DeMesa et al. |
| 2004/0210546 | A1 | 10/2004 | Spooner et al. |
| 2005/0071135 | A1 | 3/2005 | Vredenburgh et al. |
| 2005/0223320 | A1 | 10/2005 | Brintzenhofe et al. |
| 2006/0074609 | A1 | 4/2006 | Freeman et al. |
| 2006/0098009 | A1 | 5/2006 | Zuniga |
| 2007/0013709 | A1 | 1/2007 | Charles et al. |
| 2007/0033204 | A1 * | 2/2007 | Callahan ...................... 707/100 |
| 2007/0159480 | A1 | 7/2007 | Delarue et al. |
| 2008/0077365 | A1 | 3/2008 | Fukumura |
| 2008/0184185 | A1 | 7/2008 | Saelzer et al. |
| 2009/0016598 | A1 | 1/2009 | Lojewski |
| 2009/0070368 | A1 * | 3/2009 | Callahan ...................... 707/102 |
| 2009/0106530 | A1 | 4/2009 | Lauterbach et al. |
| 2009/0182972 | A1 * | 7/2009 | Greiner et al. ............... 711/206 |
| 2009/0187732 | A1 * | 7/2009 | Greiner et al. ............... 711/208 |
| 2010/0057729 | A1 * | 3/2010 | Fitt ................................. 707/5 |
| 2010/0114355 | A1 | 5/2010 | Harashima et al. |
| 2010/0198383 | A1 | 8/2010 | Richey |
| 2011/0167398 | A1 | 7/2011 | Furumoto |
| 2012/0101918 | A1 * | 4/2012 | Battle et al. ................ 705/26.63 |
| 2013/0080477 | A1 | 3/2013 | Evans et al. |
| 2013/0080478 | A1 | 3/2013 | Ben-Haim et al. |
| 2013/0132373 | A1 | 5/2013 | Huang et al. |
| 2013/0132432 | A1 | 5/2013 | Carter et al. |

OTHER PUBLICATIONS

John C. Hart, "Chapter 11—Procedural Synthesis of Geometry", in: F. Kenton Musgrave, "Texturing & Modeling", ISBN: 1-55860-848-6, 2003, San Francisco, CA, 684 pages.

Rubin et al., "A 3-Dimensional Represenation for Fast Rendering of Complex Scenes", ComputerGraphics Proceedings, Proceedings of Siggraph Annual International Conference on Computer Graphics, vol. 14, No. 3, Jan. 1, 1980, pp. 110-116.

PCT International Search Report dated Feb. 15, 2013 corresponding to PCT Application No. PCT/US2012/065837 filed Nov. 19, 2012 (12 pages).

PCT International Search Report dated Feb. 25, 2013 corresponding to PCT Application No. PCT/US2012/066186 filed Nov. 21, 2012 (16 pages).

Gobbetti et al., "Technical Strategies for Massive Model Visualization", Proceedings of the 2008 ACM symposium on Solid and Physical Modeling New York 2008, 11pages.

Kent Tegels, Hierarchy ID, Microsoft Corporation, MSDN Magazine, Sep. 2008, retrieved on Feb. 12, 2014, retrieved from internet <URL:http://msdn.microsoft.com/en-us-magazine/cc794278.aspx> (10 pages).

Estublier et al., Toward SCM/PDM Integration?, University of Grenoble, ECOOP '98 Proceedings of the SCM-8 Syposium on System Configuration Management, 1998, pp. 75-94, retrieved from the Internet <URL: http://pdf.aminer.org/000/578/207/toward_scm_pdm9_integration.pdf> (19 pages).

Tom Haughey, Modeling Hierarchies, Association with the Meta-Data and Data Modeling Summit, Jun. 14-16, 2005, retrieved on Feb. 12, 2014, retrieved from the Internet <URL: http://www.tdan.com/view-special-features/5400/> (6 pages).

Koo et al., Feasibility Study of 4D CAD in Commercial Construction, CIFE Technical Report #118, Aug. 1998, retrieved on Feb. 12, 2014, retrieved from the Internet <URL: http://cife.stanford.edu/sites/default/files/TR118.pdf> (135 pages).

Notice of Allowance for U.S. Appl. No. 13/606,555, dated Feb. 18, 2014. (21 pages).

Non-Final Office Action issued Oct. 22, 2013 in U.S. Appl. No. 13/606,574, 14 Pages.

Regli, et al., "Managing digital libraries for computer-aided design", 2000, Computer-Aided Design, Elsevier, vol. 32, pp. 119-132.

"Massive Model 3d Navigation with Right Hemisphere's Deep Vision file format"; Aug. 9, 2011, Printed from internet; http://rhdeepexploration.wordpress.com/2011/08/09/massive-model-3d-navigation-with-right-hemispheres-deep-vision-file-format/; 6 pages.

* cited by examiner

MASSIVE MODEL VISUALIZATION IN PDM SYSTEMS

CROSS-REFERENCE TO RELATED APPLICATION

This application claims priority to and the benefit of the filing date of India Patent Application 1486/KOL/2011, filed Nov. 23, 2011, which is hereby incorporated by reference. This application also includes some subject matter in common with concurrently-filed U.S. patent application Ser. No. 13/606,555 for "Massive Model Visualization with Spatial Indexing" and U.S. patent application Ser. No. 13/606,574 for "Massive Model Visualization with Spatial Retrieval", which are hereby incorporated by reference.

TECHNICAL FIELD

The present disclosure is directed, in general, to computer-aided design, visualization, and manufacturing systems, product lifecycle management ("PLM") systems, and similar systems, that manage data for products and other items (collectively, "Product Data Management" systems or PDM systems).

BACKGROUND OF THE DISCLOSURE

PDM systems manage PLM and other data. Improved systems are desirable.

SUMMARY OF THE DISCLOSURE

Various disclosed embodiments include systems and methods for improved PDM processes, including systems and methods for massive model visualization in PDM systems. A method includes storing a massive model database for a product data structure in a PDM server system, including storing a spatial bounding box hierarchy that acts as a spatial index for spatial bounding boxes of a plurality of unconfigured components of the product data structure and storing a cell table that associates cells of the spatial bounding box hierarchy to corresponding component identifiers of the product data structure. The method includes responding to component identifier requests from a client system by sending requested component identifiers from the product data structure to the client system. The component identifier requests correspond to visible components of an assembly represented by the product data structure. The method includes transmitting geometric data to the client system, the geometric data corresponding to components of the product data structure associated with the requested component identifiers.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Massive Model Visualization (MMV) systems as described in recent publications are able to render models with millions of parts by identifying the (typically small) subset of part occurrences that is actually needed to produce a correct image. Visibility-guided rendering (VGR) algorithms traverse a pre-computed spatial structure in order to determine which occurrences are potentially visible from a given eye point in an efficient manner.

While the term "bounding box" is used in this disclosure, those of skill in the art will recognize that the same principles apply to any bounding volume, whether box-shaped or not, and this term as used herein is intended to include these variations, including but not limited to general bounding volumes such as bounding spheres, ellipsoids, cylinders, capsules, slabs, discrete oriented polytopes (k-DOPs), and composite sets of volumes or k-DOPs.

Figure 1:
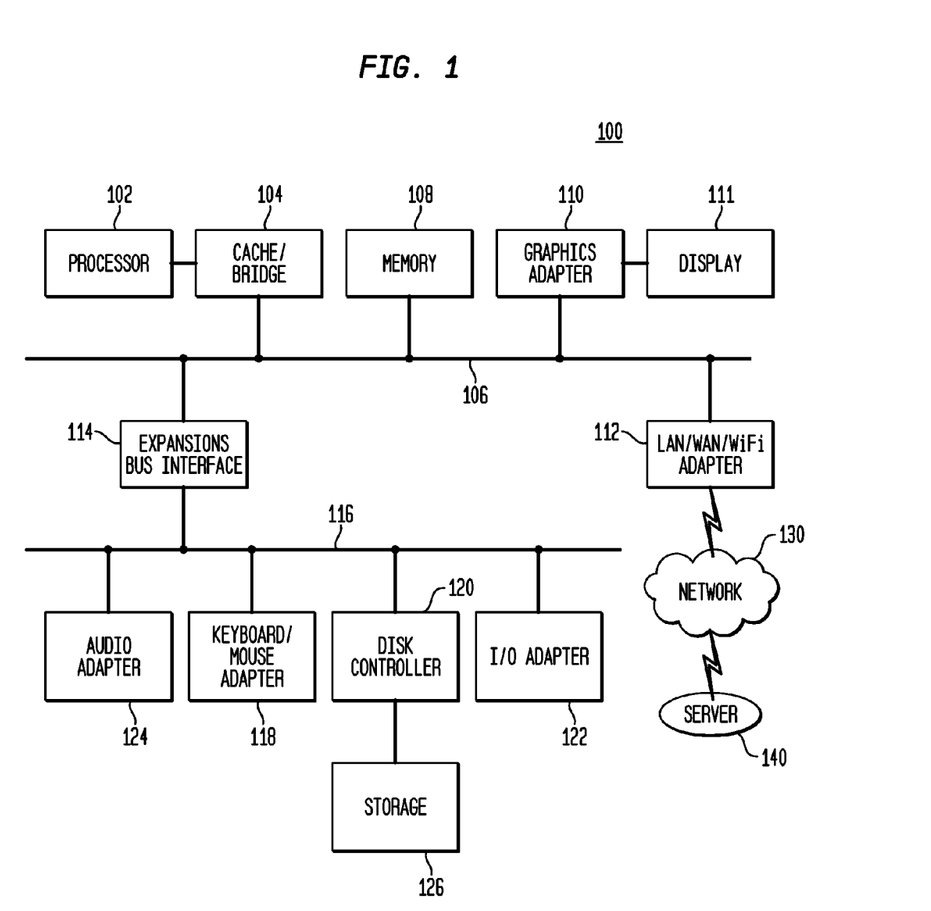
FIG. 1 depicts a block diagram of a data processing system in which an embodiment can be implemented.

FIG. 1 depicts a block diagram of a data processing system in which an embodiment can be implemented, for example as a PDM system particularly configured by software or otherwise to perform the processes as described herein, and in particular as each one of a plurality of interconnected and communicating systems as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Disclosed embodiments provide significant advantages in the ability to visualize much larger models than previous methods. This is particularly important in the context of a PDM system, in which configuring, accessing, and transmitting parts of the model from the PDM server to the visualization client is much more expensive than loading them from a traditional local or remote file system.

Disclosed embodiments can include a PDM system, method, and apparatus for MMV visualization with dynamic PDM-based structure configuration. Various embodiments include MMV systems that operate on models stored in a PDM system and organized into a PDM structure, such as a bill of materials (BOM) structure of configured or unconfigured occurrences, and can include a client-server MMV system that operates on unconfigured models stored in a PDM system.

Disclosed embodiments also include systems and methods that use a dynamic PDM-based structure query for visibility, and display management systems and methods for dynamically-determined subsets of massive models. Such embodiments can provide the ability to only render a specific (but arbitrary) sub-set of the model, and in particular, any sub-set defined by a collection of product structure nodes. In other words, instead of making the entire model visible, disclosed embodiments allow the rendering client to restrict the visibility to any collection of the model's sub-assemblies or parts. The product structure (or component) nodes can include a cell index value for a corresponding product component that identifies the product component's spatial location according to defined cells of a three-dimensional model of the product assembly.

Some embodiments provide the ability to dynamically apply arbitrary display attributes (color, texture, etc.) to a specific (but arbitrary) subset of the model's part occurrences. In other words, various embodiments allow the rendering client to dynamically switch display attributes such that some of the model's part occurrences may originally be rendered with their native display attributes, and then dynamically switched to being rendered with some other display attributes. This capability can be used for rendering "selected" parts in a specific color, for coloring parts based on metadata, etc.

Figure 2:
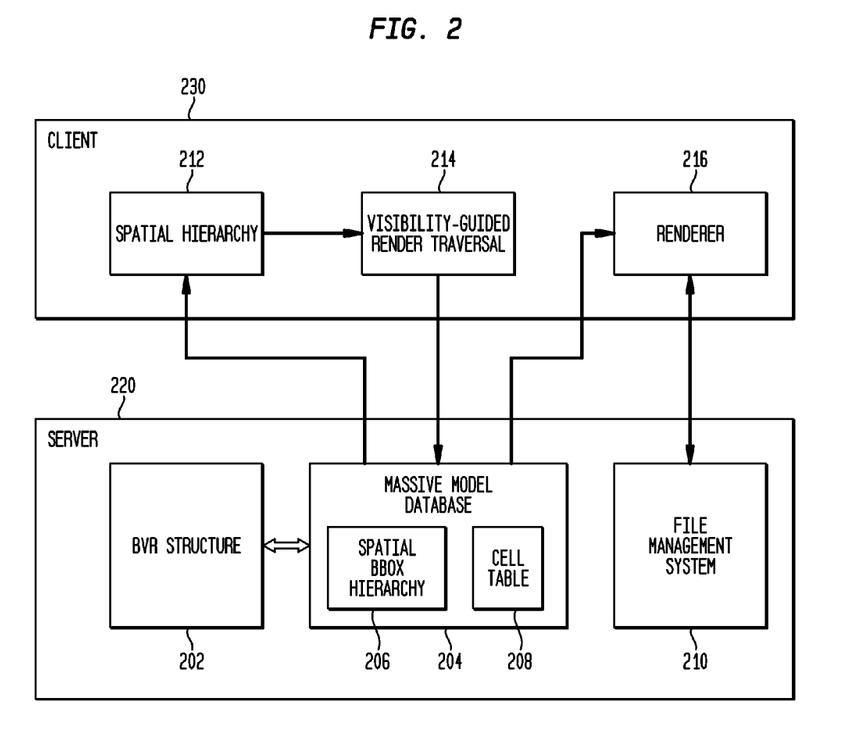
FIG. 2 illustrates an overview of how various embodiments interrelate disclosed MMV visualization technologies to other PDM system functions in accordance with disclosed embodiments.

FIG. 2 illustrates an overview of how various embodiments interrelate disclosed MMV visualization technologies to other PDM system functions. Various PDM functions can be implemented using the Teamcenter PDM software product by Siemens Product Lifecycle Management Software Inc.

There are two main stages illustrated in this figure. The first stage is to "harvest" an existing product structure into a Massive Model Database (MMDB) 204. The MMDB has two components, a spatial bounding box (BBox) hierarchy 206 that serves as a spatial index for the bounding boxes of the harvested product structure components, and a cell table 208 that ties the hierarchy's cells to the original components. For example, a Cell C4 in cell table 208 can contain components A and B.

A "cell" refers to a defined area or volume of a model, and can be used to identify the components, parts, or nodes that are wholly or partially contained by that cell. The product or assembly can be subdivided into three-dimensional "cells" or regions that are each assigned an index value. One or more of those index value can then be associated with each component to describe its geometric or spatial location according to the defined cells, and such index values can therefore be used to identify the relative locations of different components. A single spatial index value may be associated with multiple components or occurrences, which would indicate that they share the same 3D cell (in whole or in part). A cell query can be regarded as a request for the system to identify "what is in this cell?".

That is, a three-dimensional space may be subdivided into defined cells, and each of these cells may have an index value. Each of the product structure components can be associated with a bounding box that describes the geometric bounds of that component. The spatial BBox hierarchy 206 serves as a spatial index of each of these bounding boxes with respect to the defined cells, and the cell table 208 associates the cells of the spatial BBox hierarchy 206 with the original components. Of course, the spatial bounding box hierarchy can be represented as any structure that performs as the spatial index described herein.

Not all visualization use cases require that the entire model be shown. Often, the user wishes to specify a sub-set of the model to be visible, typically by using assembly and part nodes of a product structure. Disclosed embodiments provide advantages by enabling efficient management and rendering of such visible sub-sets, in the context of MMV, from a PDM server.

FIG. 2 shows the example of a BOMView Revision (BVR) product structure 202 being harvested into a massive model database 204 on server 220, but this is not essential to the to the various embodiments; the techniques described herein apply to any managed product structure data model. PDM systems can provide product structure configuration. The product data structure 202 can be, for example, a hierarchical tree structure that represents the product in terms of its assemblies, sub-assemblies, components, parts, occurrences, and the configuration data as described herein.

The BVR structure 202 as illustrated in FIG. 2 represents a 150% model, i.e., it contains all possible configurations of a product, with all revisions, variants, effectivities, etc. A real-world 100% product is obtained by applying a configuration with specific rules for fixing the revision, variant, effectivity, etc. Various embodiments can specifically avoid structure configuration for the harvesting step. Instead, disclosed embodiments can compute spatial bounding boxes (BBoxes) based on the unconfigured product structure. For example, if a part A has 10 revisions with different geometric designs and different bounding boxes, the MMDB spatial BBox hierarchy would be based on a bounding box of part A that contains all revisions.

In exemplary embodiments, the MMDB spatial BBox hierarchy 206 is saved as a file in massive model database 204 on server 220, and can be stored on the root of the BVR structure 202 as a data set. The MMDB cell table 208 can implemented as a server table in massive model database 204. A BVR harvester process can "harvest" the BVR structure 202 into the massive model database 204 in an initial step of a process.

The second main stage is to launch the root of the BVR structure 202 into a client viewer on a client system 230, with a given configuration. The viewer initializes any configuration mechanisms and downloads the spatial BBox hierarchy 206 of the MMDB to be stored as spatial BBox hierarchy 212 in client system 230. Then, the renderer 216 starts rendering.

For each frame being rendered, the given eye point is used to traverse the spatial hierarchy front-to-back, shown as visibility-guided render traversal 214. During this traversal, occlusion queries are asynchronously sent to the graphic card and exploited for culling cells. For each cell that is determined to be potentially visible from the eye point, a request for the component geometry is sent to the PDM server 220.

The server consults the cell table 208 to find the unconfigured components corresponding to the selected cell; for example components A and B of a cell C4. The system then configures them in a conventional manner. This may result in some of the cell's components being discarded, as they may not be within the given configuration. For the surviving components, access information is sent back to the client 230.

The viewer on client 230 uses this component information to actually retrieve the geometry, such as from a database or file management system 210 on server 220. In certain embodiments, the geometry can be stored in JT files, known to those of skill in the art. Finally, the client system 230 receives the geometry and renders it using renderer 216. Conceptually, the process then returns to the render traversal. In practice, much of the systems and processes described herein can be multi-threaded. In particular, the render traversal, cell information request, and geometry retrieval can all be executed on one or more separate threads, and geometry retrieval may even be on several threads itself.

Some steps can be implemented using some known functions, such as the render traversal and the geometry retrieval, and detailed descriptions of such known processes are omitted herein. Disclosed embodiments can use processes disclosed herein for the unconfigured harvesting, spatial hierarchy download, and cell request, including the on-the-fly configuration.

Figure 3:
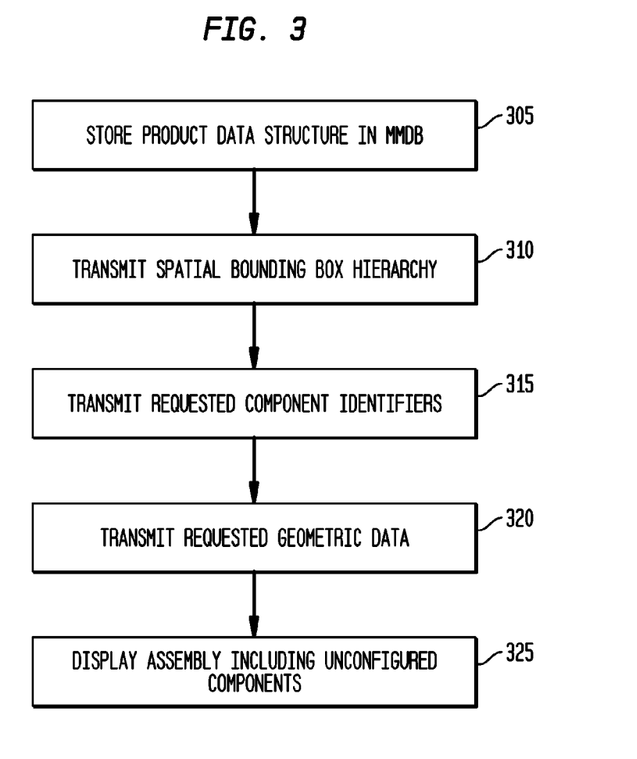
FIGS. 3-5 depict flowcharts of processes in accordance with disclosed embodiments.

FIG. 3 depicts a flowchart of a process in accordance with disclosed embodiments, that can be implemented by one or more PDM systems as described herein. The "system" in this process is preferably but not necessarily a PDM server system.

The system stores a massive model database for a product data structure (step 305). The product data structure is preferably at least partially unconfigured, and represents a product assembly. This step can include storing a spatial bounding box hierarchy that acts as a spatial index for the geometric/spatial bounding boxes of the components of the product data structure, including the cumulative bounding boxes of unconfigured components. This step can include storing a cell table that ties the cells of the spatial bounding box hierarchy to the corresponding component identifiers of the product data structure.

The system transmits the spatial bounding box hierarchy to a client system (step 310).

The system responds to component identifier requests from the client system by sending requested component identifiers from the product data structure to the client system (step 315). The requests can be sent by the client system that determines, based on the spatial bounding box hierarchy, which of the cells in the spatial bounding box hierarchy of the assembly represented by the product data structure are visible from a given viewpoint. The response identifies the components (or configured occurrences) that correspond to the cells indicated by the client in the component identifier request.

The system responds to geometry requests from the client system by sending geometric data corresponding to components of the product data structure associated with component identifiers in the geometry request (step 320). In other embodiments, steps 315 and 320 can be combined, so that the system automatically sends to the client any geometry associated with the requested component identifiers.

The system can configure the product data structure and its components as part of steps 315 or 320, or otherwise, and can perform this configuration based on data received from the client system. In these cases, the geometric data sent to the client system in step 320 can be according to the configured product data structure; that is, data sent to the client for display will generally only include configured data, so that only certain occurrences and variants are displayed in accordance with the configuration.

The client system can then use the transmitted geometry to display the components of the assembly represented by the product data structure that are visible from the given viewpoint (step 325). This step can include dynamically configuring the unconfigured components and updating the display according to the dynamic configuration, particularly in cases where the product data structure was not previously configured by the system.

One important performance aspect of some embodiments is that the rendering client only retrieves sufficient product structure from the server to specify the visible sub-assemblies; the client does not retrieve any non-visible product structures within those sub-assemblies.

Embodiments described above allow the rendering of massive models in their entirety, for example, an airplane or a car. In practice, the user often only wants to make a set of sub-assemblies or parts visible, for example, a wing or an engine. One observation is that the MMV processes described above do not require the viewer to download any product structure from the server. Disclosed embodiments allow client systems to render only a sub-assembly, without forcing the viewer to download any product structure below that sub-assembly's root node, as this structure could be arbitrarily large. For example, a user making the entire electrical system of an airplane visible could produce a prohibitively large structure.

Existing techniques fail to efficiently manage and render visible sub-sets because they tend to enumerate all visible parts of the model before visualization even begins. A dynamic structure query mechanism as disclosed herein greatly increases perceived performance by executing the visibility query on the PDM server, and only for those parts of the model that potentially appear on the screen. The result is a drastic improvement in viewer response time, both in terms of quickly seeing some result on the screen, and also in terms of seeing the complete correct image.

Disclosed embodiments solve the product structure visibility problem by determining on the server, rather than on the client, whether a part belongs to the visible sub-assembly. For this purpose, the client viewer defines a "search cursor" on the server that contains the root nodes of the visible sub-assemblies. When the server handles a cell request as described above, it not only resolves the configuration for the cell's components as described above, but it also checks whether the components should be visible. This is the case if the components in the product structure are located below the search cursor's sub-assemblies' root nodes.

Figure 4:
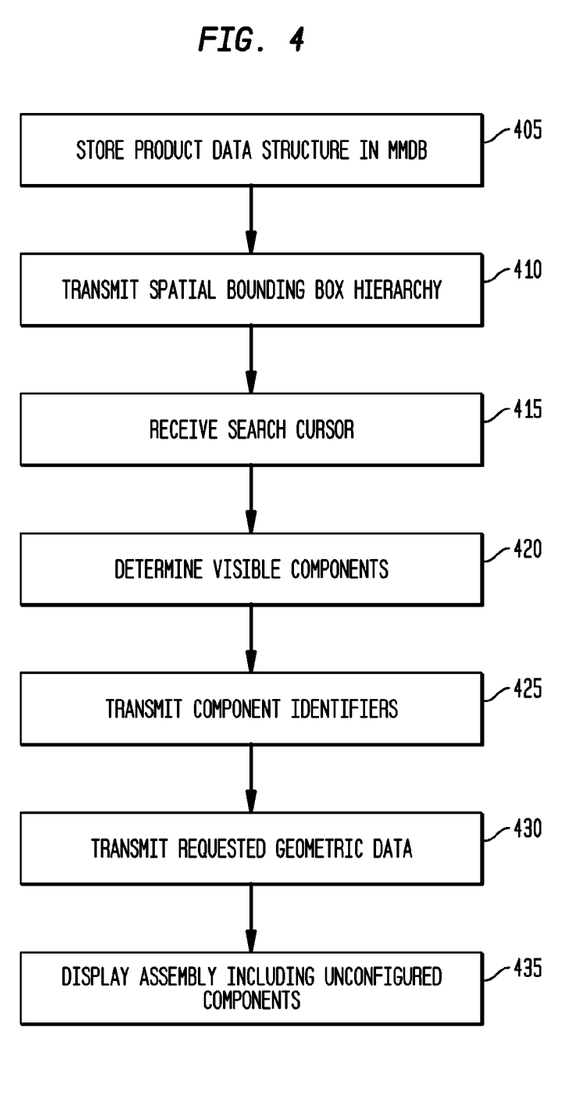

FIG. 4 depicts a flowchart of a process in accordance with disclosed embodiments that can be implemented by one or more PDM systems as described herein and that modifies a process as in FIG. 3 by performing visibility-determination processes on the server side. The "system" in this process is preferably but not necessarily a PDM server system.

The system stores a product data structure in a massive model database (step 405). The product data structure is preferably at least partially unconfigured, and represents a product assembly. This step can include storing a spatial bounding box hierarchy that acts as a spatial index for the geometric/spatial bounding boxes of the components of the product data structure, including the cumulative bounding boxes of unconfigured components. This step can include storing a cell table that ties the cells of the spatial bounding box hierarchy to the corresponding component identifiers of the product data structure.

The system transmits the spatial bounding box hierarchy to a client system (step 410).

The system receives a search cursor that contains the root nodes of visible sub-assemblies represented by the product data structure as represented in the spatial bounding box hierarchy (step 415). This can be received from the client system, based on a user selection of sub-assemblies to make visible. That is, a user of the client system can interact with an assembly tree user interface on the client system and selectively "turn on" one or more sub-assemblies. The given viewpoint may be, for example, user-selected or system-selected. The search cursor can be multiple inputs received from the client system, and can correspond to a user input on the client system. The client system can also determine occlusion of various components, and which are and are not be visible according to the spatial bounding box hierarchy.

The system determines, based on the spatial bounding box hierarchy and the search cursor, the cells and components that correspond to the search cursor (step 420). This can include performing a search of the product data structure to identify components of each of the sub-assemblies that correspond to the search cursor, and can include determining which of the identified components are visible from the given viewpoint. The PDM server system can identify components of sub-assemblies that correspond to the search cursor by determining component occurrences that are in a respective cell of the cell table. As part of this step, the system can also receive, from the client system, an identification of the given viewpoint.

The system transmits component identifiers, for the components determined to be visible, from the product data structure to the client system (step 425). The system can configure the product data structure and its components as part of steps 420 or 425, or otherwise, and can perform this configuration based on data received from the client system. In these cases, the geometric data sent to the client system in step 430 can be according to the configured product data structure; that is, data sent to the client for display will generally only include configured data, so that only certain occurrences and variants are displayed in accordance with the configuration.

The system responds to geometry requests from the client system by sending geometric data corresponding to components of the product data structure associated with component identifiers in the geometry request (step 430). In other embodiments, steps 425 and 430 can be combined, so that the system automatically sends to the client any geometry associated with the requested component identifiers.

The client system can then use the transmitted geometry to display the components of the assembly represented by the product data structure that are visible from the given viewpoint, including unconfigured components, that also correspond to the search cursor (step 435).

In various embodiments, the PDM server system receives a search cursor that contains a plurality of root nodes of visible sub-assemblies represented by the product data structure, and the requested component identifiers sent to the client system correspond to components of an assembly represented by the product data structure that correspond to the search cursor.

Embodiments disclosed herein allow the rendering of massive models in their entirety, and other disclosed embodiments above include using server search cursors for rendering a user-defined subset of the model. Other embodiments cover the general management of model subsets and their display attributes.

Usually components are rendered with their pre-defined display attributes. For example, the CAD designer may have defined a two-part component to be red and blue, respectively. However, there are many circumstances that may require rendering these parts differently, for example, if they have been explicitly selected by the user, such as by a left-mouse click, or are in collision with other geometry. Disclosed embodiments introduce the concept of a "slice" that ties together the definition of a component subset with its display attributes. For example, one slice may be defined as IsSelected=(all selected components; yellow)

or another as

InCollision=(all components in collision; red).

The term "slice" is used because each such definition isolates a piece of the entire set of components represented in the spatial hierarchy, so that it "slices through the hierarchy". Of course, this term is arbitrary and any other term could be used if it describes an equivalent concept in a process as described and claimed herein.

One important aspect of a slice is that the system must be able to evaluate a membership function: "Does this component belong to this slice?". Membership functions may be evaluated on the client, for example, whether or not a component is selected. Other membership functions may be evaluated on the server by a search cursor, for example, for visibility as described herein.

Another important aspect of slices is that they are used for determining the final display attributes of a component. This is done by managing the set of slice definitions with priorities. For the example above, one might have IsSelected=(all selected components; yellow; 2)

and

InCollision=(all components in collision; red; 1)

When a component is considered for rendering, then first all of its slice memberships are evaluated. Next, the slice priority is consulted, and the display attributes of the slice with the highest priority are used, in this example. For example, suppose a component belongs to both the IsSelected and InCollision slices, then it would be rendered yellow, as the IsSelected slice has the higher priority (2 vs. 1). In summary, this means that the viewer can express coloring policy as slice priorities, and the system can evaluate and process such priorities.

Many visualization use cases require that a certain subset of the model's parts are temporarily rendered with particular display attributes. For example, the set of "selected" parts may be rendered in yellow, while all other parts of the model are rendered with their original display attributes. Disclosed embodiments provide advantages by allowing the dynamic switching of display attributes in the context of Massive Model Visualization from a PDM server, where the number of affected parts may be very large.

Figure 5:
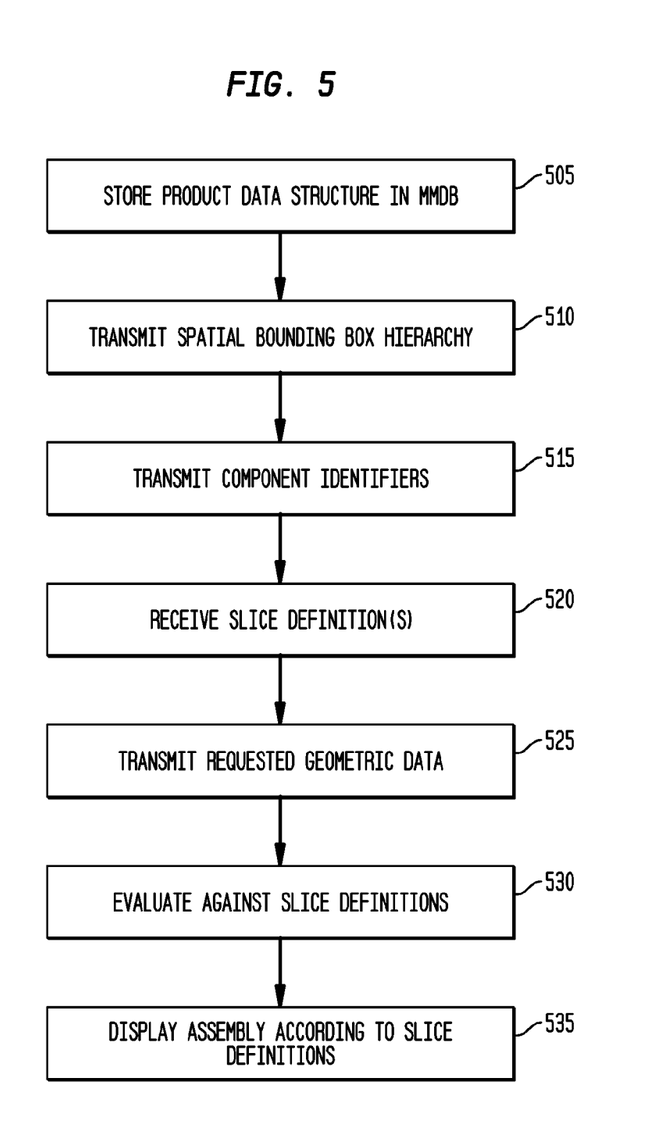

FIG. 5 depicts a flowchart of a process in accordance with disclosed embodiments that can be implemented by one or more PDM systems as described herein and that modifies a process as in FIG. 3 by performing slice-evaluation process to determine visualization attributes as described herein. The "system" in this process is preferably but not necessarily a PDM server system.

The system stores a product data structure in a massive model database (step 505). The product data structure is preferably at least partially unconfigured, and represents a product assembly. This step can include storing a spatial bounding box hierarchy that acts as a spatial index for the geometric/spatial bounding boxes of the components of the product data structure, including the cumulative bounding boxes of unconfigured components. This step can include storing a cell table that ties the cells of the spatial bounding box hierarchy to the corresponding component identifiers of the product data structure.

The system transmits the spatial bounding box hierarchy to a client system (step 510).

The system responds to component identifier requests from the client system by sending requested component identifiers from the product data structure to the client system (step 515). The requests can be sent by the client system that determines, based on the spatial bounding box hierarchy, which of the components of the assembly represented by the product data structure are visible from a given viewpoint. The transmitted component identifiers can include unconfigured components.

The system receives at least one slice definition (step 520). The slice definition defines a display attribute for a subset of the components in the product data structure. The subset can be arbitrarily identified, including components that are selected, are in collision, have a specific relationship to another component or assembly, have a specific attribute, or otherwise. The display attribute can be, for example, a specified display color, a visibility/invisibility indicator, or otherwise. The slice definition(s) can also include a priority indicator. This step, in particular, can be performed either on the server system or on the client system. Receiving can include loading from storage, receiving from another system or process, or receiving via an input from a user.

The system responds to geometry requests from the client system by sending geometric data corresponding to components of the product data structure associated with component identifiers in the geometry request (step 525). In other embodiments, steps 515 and 525 can be combined, so that the system automatically sends to the client any geometry associated with the requested component identifiers.

The system evaluates each of the requested components, or the corresponding geometric data, against the slice definition(s) (step 530). This step in particular can be performed either on the server system or on the client system. This step can include sending, from the server system to the client system, the results of the evaluation for each of the components or the corresponding geometric data. This step can also include evaluating each of the requested components, or the corresponding geometric data, against multiple slice definitions according to the priority indicator of each slice definition.

The client system can then use the transmitted geometry to display the components of the assembly represented by the product data structure that are visible from the given viewpoint, including unconfigured components, according to the evaluated slice definitions (step 535). In this way, the components can be displayed using the display attribute defined by the slice definition having the highest priority for each respective component.

Figure 6:
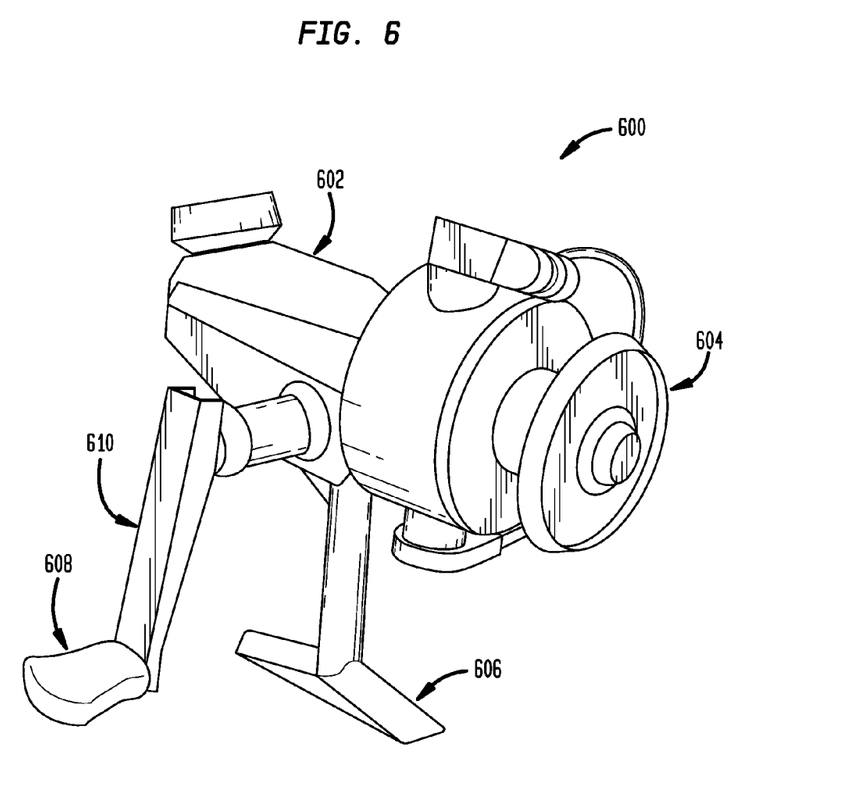
FIG. 6 shows an example of displayed components of a reel assembly, in accordance with disclosed embodiments.

FIG. 6 shows an example of displayed components of a reel assembly 600. In this example, from the given view point, only certain parts and sides of the assembly 600 are shown, while other portions are "invisible" or not shown. For example, housing 602 is shown, but the components inside or behind housing 602 are not shown. Slice definitions can be used to display only subsets of the assembly 602. For example, a slice definition could define the "body" as including the geometric features that compose the housing 602 and the mount 606. If a user selects, for example, this slice definition to have a specific color, then the housing 602 and the mount 606 would be displayed in this color. Similarly, the user could choose to use this slice definition to display only the "body", and hide all other components, in which case spindle 604 would not be displayed, or could make other selections such as by using a search cursor as described herein.

Further, using the bounding-box techniques described herein, the user could select to display all components of reel 600 that are in the same cell as handle 608, which may include arm 610 but no other portion of the reel 600. Handle 608 could be an unconfigured component, such as one of several possible handles according to different variants; in other cases, the PDM server can dynamically configure the component in response to the client request to send only a configured handle.

A significant difference between various techniques described herein and those known in the art is that undisplayed components, such as those behind or within the housing 602, are not rendered at all in accordance with disclosed embodiments. Other systems use a "render everything" technique where components inside or behind the housing are rendered but then are not shown because of ordinary depth buffering.

According to disclosed embodiments, the system detects that these components are obscured before they are rendered and so the system doesn't render them at all. This is a significant technical advantage over other systems that rendered these components, but then discarded all the rendered pixels because only at the end could it determine that those pixels were obscured.

Embodiments disclosed above also provide other significant technical advantages over previous systems that describe spatial structures of fully configured models only. When multiple similar configurations of a model must be visualized, the unconfigured superset of all models' occurrences can be built into a single spatial structure, using disclosed techniques, thus avoiding the waste of multiple copies of common occurrences and allowing the user the flexibility of specifying the model configuration dynamically at visualization time.

Another benefit of the system is increased performance. Only occurrences that are determined to be potentially visible need be configured. This has the effect of greatly reducing the number of occurrences that must be configured on the PDM system. Since this configuration action is typically a serious performance bottleneck, disclosed embodiments provide a significant advantage and performance benefit by allowing any configuration step to be performed after visualization processes as described herein. An occurrence, in this context, can be a part, such as a sub-assembly or component part in some higher level assembly, and an unconfigured occurrence can be an occurrence that may or may not be present or visible in the assembly depending on the (yet-unspecified) configuration. Unconfigured occurrences can be, for example, mutually exclusive in various configurations; disclosed embodiments enable users to view such unconfigured occurrences at the same time without restricting the view to specific configurations.

Of course, those of skill in the art will recognize that, unless specifically indicated or required by the sequence of operations, certain steps in the processes described above may be omitted, performed concurrently or sequentially, or performed in a different order. Steps and operations of the various processes can be combined in various embodiments.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for massive-model visualization, comprising:
    storing a massive model database for a product data structure in a product data management (PDM) server system, including storing a spatial bounding box hierarchy that acts as a spatial index for spatial bounding boxes of a plurality of unconfigured components of the product data structure and storing a cell table that associates cells of the spatial bounding box hierarchy to corresponding component identifiers of the product data structure;
    responding to component identifier requests from a client system by sending requested component identifiers from the product data structure to the client system, wherein the component identifier requests correspond to visible components of an assembly represented by the product data structure; and
    transmitting the bounding box hierarchy and geometric data to the client system, the geometric data corresponding to components of the product data structure associated with the requested component identifiers, wherein the client system determines, based on the spatial bounding box hierarchy, the components of the assembly represented by the product data structure that are visible, and wherein the client system can use the transmitted geometry to display the components of an assembly represented by the product data structure that are visible from the given viewpoint, including at least one of the plurality of unconfigured components.

2. The method of claim 1, wherein the client system determines the components of the assembly represented by the product data structure and the spatial bounding box hierarchy.

3. The method of claim 1, wherein the PDM server system dynamically configures the unconfigured components, and transmits the geometric data according to the dynamic configuration.

4. The method of claim 1, wherein the PDM server system receives a search cursor that contains a plurality of root nodes of visible sub-assemblies represented by the product data structure, and wherein requested component identifiers sent to the client system correspond to components of an assembly represented by the product data structure that are visible and that correspond to the search cursor.

5. The method of claim 1, wherein the PDM server system identifies components of sub-assemblies that correspond to the search cursor by determining component occurrences that are in a respective cell of the cell table.

6. The method of claim 1, further comprising receiving at least one slice definition that defines a display attribute for a subset of the components in the product data structure.

7. The method of claim 6, further comprising evaluating each of the components of an assembly represented by the product data structure, that are visible from a given viewpoint, against the slice definition.

8. The method of claim 7, wherein the client system displays the components of the assembly represented by the product data structure that are visible from the given viewpoint according to the evaluated slice definition.

9. A product data management (PDM) server system comprising:
at least one processor; and
an accessible memory, the PDM server system configured to:
store a massive model database for product data structure in a product data management (PDM) server system, including storing a spatial bounding box hierarchy that acts as a spatial index for spatial bounding boxes of a plurality of unconfigured components of the product data structure and storing a cell table that associates cells of the spatial bounding box hierarchy to corresponding component identifiers of the product data structure;
respond to component identifier requests from a client system by sending requested component identifiers from the product data structure to the client system, wherein the component identifier requests correspond to visible components of an assembly represented by the product data structure; and
transmit the bounding box hierarchy and geometric data to the client system, the geometric data corresponding to components of the product data structure associated with the requested component identifiers, wherein the client system determines, based on the spatial bounding box hierarchy, the components of the assembly represented by the product data structure that are visible, and wherein the client system can use the transmitted geometry to display the components of an assembly represented by the product data structure that are visible from the given viewpoint, including at least one of the plurality of unconfigured components.

10. The PDM server system of claim 9, wherein the client system determines the components of the assembly represented by the product data structure and the spatial bounding box hierarchy.

11. The PDM server system of claim 9, wherein the PDM server system dynamically configures the unconfigured components, and transmits the geometric data according to the dynamic configuration.

12. The PDM server system of claim 9, wherein the PDM server system receives a search cursor that contains a plurality of root nodes of visible sub-assemblies represented by the product data structure, and wherein requested component identifiers sent to the client system correspond to components of an assembly represented by the product data structure that are visible and that correspond to the search cursor.

13. The PDM server system of claim 9, wherein the PDM server system identifies components of sub-assemblies that correspond to the search cursor by determining component occurrences that are in a respective cell of the cell table.

14. The PDM server system of claim 9, wherein the PDM server system receives at least one slice definition that defines a display attribute for a subset of the components in the product data structure.

15. The PDM server system of claim 14, wherein the PDM server system evaluates each of the components of an assembly represented by the product data structure, that are visible from a given viewpoint, against the Slice definition.

16. The PDM server system of claim 15, wherein the PDM server system displays the components of the assembly represented by the product data structure that are visible from the given viewpoint according to the evaluated slice definition.

17. A non-transitory computer-readable medium encoded with computer-executable instructions that, when executed, cause a product data management (PDM) server system to:
store a massive model database for a product data structure in a product data management (PDM) server system, including storing a spatial bounding box hierarchy that acts as a spatial index for spatial bounding boxes of a plurality of unconfigured components of the product data structure and storing a cell table that associates cells of the spatial bounding box hierarchy to corresponding component identifiers of the product data structure;
respond to component identifier requests from a client system by sending requested component identifiers from the product data structure to the client system, wherein the component identifier requests correspond to visible components of an assembly represented by the product data structure; and
transmit the bounding box hierarchy and geometric data to the client system, the geometric data corresponding to components of the product data structure associated with the requested component identifiers, wherein the client system determines, based on the spatial bounding box hierarchy, the components of the assembly represented by the product data structure that are visible, and wherein the client system can use the transmitted geometry to display the components of an assembly represented by the product data structure that are visible from the given viewpoint, including at least one of the plurality of unconfigured components.

18. The computer-readable medium of claim 17, wherein the client system determines the components of the assembly represented by the product data structure and the spatial bounding box hierarchy.

19. The computer-readable medium of claim 17, wherein the PDM server system dynamically configures the unconfigured components, and transmits the geometric data according to the dynamic configuration.

20. The computer-readable medium of claim 17, wherein the instructions cause the PDM server system to receive a search cursor that contains a plurality of root nodes of visible sub-assemblies represented by the product data structure, and wherein requested component identifiers sent to the client system correspond to components of an assembly represented by the product data structure that are visible and that correspond to the search cursor.

21. The computer-readable medium of claim 17, wherein the instructions cause the PDM server system to identify components of sub-assemblies that correspond to the search cursor by determining component occurrences that are in a respective cell of the cell table.

22. The computer-readable medium of claim 17, wherein the instructions cause the PDM server system to receive at least one slice definition that defines a display attribute for a subset of the components in the product data structure.

23. The computer-readable medium of claim 22, wherein the instructions cause the PDM server system to each of the components of an assembly represented by the product data structure, that are visible from a given viewpoint, against the slice definition.

24. The computer-readable medium of claim 23, wherein the instructions cause the PDM server system to display the components of the assembly represented by the product data structure that are visible from the given viewpoint according to the evaluated slice definition.

* * * * *